Figure 1:
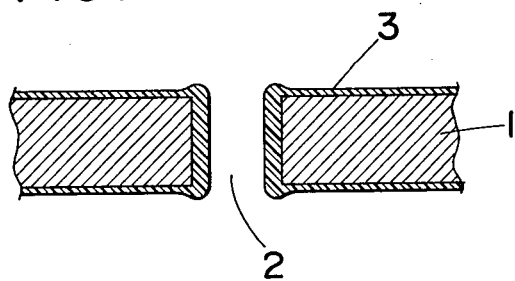

United States Patent [19]

Takahashi et al.

[11] 4,188,415
[45] Feb. 12, 1980

[54] BASEBOARD FOR PRINTED CIRCUIT BOARD AND METHOD OF PRODUCING THE SAME

[75] Inventors: Hiroshi Takahashi, Kasama; Kiyoshi Nakao, Yuki; Masaaki Katagiri, Houya, all of Japan

[73] Assignee: Hitachi Chemical Company, Ltd., Tokyo, Japan

[21] Appl. No.: 833,359

[22] Filed: Sep. 14, 1977

[30] Foreign Application Priority Data

Sep. 14, 1976 [JP] Japan .................. 51-110268

[51] Int. Cl.$^2$ .............................................. B05D 5/12
[52] U.S. Cl. .................................. 427/97; 427/96; 427/98; 428/137; 428/901
[58] Field of Search .................. 428/137, 901; 427/96–99; 204/15

[56] References Cited

U.S. PATENT DOCUMENTS

| 3,034,930 | 5/1962 | Foudriat, Jr. | 427/97 |
| 3,296,099 | 1/1967 | Dinella | 204/15 |
| 3,334,395 | 8/1967 | Cook et al. | 29/625 |
| 3,682,785 | 8/1972 | Russo | 204/15 |
| 3,745,095 | 7/1973 | Chadwick et al. | 427/97 |
| 3,873,756 | 3/1975 | Gall et al. | 427/97 |

*Primary Examiner*—George F. Lesmes
*Assistant Examiner*—P. Thibodeau
*Attorney, Agent, or Firm*—Armstrong, Nikaido, Marmelstein & Kubovcik

[57] ABSTRACT

A baseboard having through-holes for a printed circuit board which baseboard is made from a metal as a substrate, comprising at least one resin coat layer formed on the overall surface of the metal substrate including the inner wall surfaces of the through-holes and having, at the circumferential angular portions of the through-holes, a thickness larger than that on said upper and said lower surface of the metal substrate, and featured by its increased insulation characteristics at the circumferential angular portions of the through-holes, and a method of producing the same.

27 Claims, 3 Drawing Figures

BASEBOARD FOR PRINTED CIRCUIT BOARD AND METHOD OF PRODUCING THE SAME

This invention relates to a printed circuit board and a method of producing the same. More particularly, this invention is concerned with a baseboard having through-holes for a printed circuit board which baseboard is made from a metal as a substrate and is featured by its increased insulation characteristics, especially at the circumferential angular portions of the through-holes, and a method of producing the same.

Conventionally, there have generally, widely been used printed circuit boards in which organic materials, e.g. phenol fiber laminates or epoxy glass laminates, are employed as the substrates. With such conventional organic material-based printed circuit boards it has become difficult to satisfy various physical characteristics required for circuit boards to be used for the latest models of electronic instruments in which high density of an electric circuit is demanded more and more. The required characteristics include, for example, high capacity of diffusion and radiation of heat and mechanical strength capable of withstanding heavy weight on board. In view of these requirements, printed circuit boards employing as a substrate a metal has recently come to attract attention in the art. However, such metal-based printed circuit boards naturally involve the problem of insulation. Particularly, the technique for complete insulation of the inner walls of the through-holes of printed circuit boards employing a metal substrate is very important, but an effective technique has not yet been available.

For insulating the inner walls of the through-holes perforated in a metal substrate, there has heretofore been proposed, for example, a method wherein the metal substrate having on its surface an organic or inorganic insulating layer is perforated to have through-holes of a diameter larger than the predetermined diameter and an insulating resin material is filled in the through-holes, whereupon the metal substrate is perforated again at its resin material-filled portions to obtain desired through-holes having a predetermined diameter. This method, however, has a disadvantage that it requires two different steps, namely, filling of an insulating resin material and re-perforation of through-holes, leading to complicatedness of the fabrication procedures and high cost in the production.

It also is known to obtain an insulated metal substrate by providing an insulating resin coat layer on the surface of the metal substrate and the inner wall surfaces of the through-holes simultaneously. The methods of this kind include a powder fluid-bed coating method (FBC), an electrostatic powder coating method and an electrophoresis deposition method (electrodepositing method). In these methods, however, there are involved disadvantages as follows:

In the FBC method and the electrostatic powder coating method, it is very difficult to form a resin coat layer at the circumferential angular portions defined by the inner wall surfaces of the through-holes and the upper and the lower surface of the metal substrate. Illustratively stated, in these methods in which the resin materials are coated on a metal substrate in the state of particles and then cured by heating to form the resin coat layer, the thus formed resin coat layer is inevitably caused to have a remarkably decreased thickness at the circumferential angular portions of the through-holes because the resin particles coated on the metal substrate in the inner walls of the through-holes are molten during the heating for curing and tend to flow down by the surface tension generated at that time. In addition, during the melting of the resin particles, formation of pinholes and the like is liable to occur, thereby causing the insulation characteristics at the circumferential angular portions of the through-holes to be deteriorated. For this reason, in these conventional methods, in order to obtain a sufficient insulation characteristics at the circumferential angular portions of the through-holes, it is necessary to apply a large amount of resin material to the metal substrate. This tends to result in an excess thickness of resin coat film on the surface of the metal substrate as well as the inner wall surfaces of the through-holes, leading to a fear of clogging of the through-holes. To avoid such clogging of the through-holes with the resin material, the through-holes must be perforated larger in diameter. However, this, in turn, brings about another difficulty in the formation of high density circuit.

In the electrophoresis deposition method which is generally believed to give a relatively good insulating coating to the circumferential angular portions of the through-holes, there is a necessity to impart mobility of electrical charge to the resin particles in a solution of resin. The condition requirements due to such necessity to give the mobility are not compatible with the condition requirements for giving desired characteristics of printed circuit boards such as good insulation, heat resistance and the like. In addition, there are difficulties in the regulation of electrodepositing solution and the treatment of the waste liquid.

Even if an insulating layer is formed by any of the above-mentioned conventional methods, it has generally not yet been simply available to form a printed circuit directly on the insulating layer. Because, with provision of only such insulating layer, it is not sufficient to impart high adhesion characteristics and heat resistance to the printed circuit. Therefore, an adhesive layer should be additionally formed on the insulating layer. In this connection, it should be noted that, even in the conventional printed circuit boards employing as the substrate an organic material, it is usual to apply an adhesive coating onto only the surface of the substrate and perforating holes in the substrate, directly followed by provision of the printed circuit. Usually, due to the technical difficulty, application of an adhesive coating onto the inner wall surfaces of the through-holes has been omitted. For this reason, even in producing the conventional printed circuit board employing as the substrate an organic material, very careful attention is always required to prevent such defects as poor adhesion characteristics to circuit and poor heat resistance to soldering which are likely to occur very frequently in the through-holes as well as a defect caused by heat strain between the metals at the portions where the conductors formed on the inner walls of the through-holes contact with those formed on the flat surface of the board.

Those defects as mentioned above are more likely to occur when a metal is used as the substrate of a baseboard for a printed circuit board. Accordingly, it is indispensable to provide adhesive layers on the inner walls of the through-holes of the metal substrate. Formation of adhesive layers as well as insulating layers on only the flat surface of the metal substrate can be easily made according to the ordinary methods. However, for a metal substrate having through-holes, there has not yet been developed any effective technique for applying adhesive layers as well as insulating layers onto the inner wall surfaces of the through-holes.

As a method of coating the inner wall surfaces of the through-holes with an adhesive there has heretofore been proposed a spray coating method or a method wherein the adhesive is transfer-coated on the inner wall surfaces of the through-holes by moving a ball pin coated with a solution of an adhesive along the inner walls of the through-holes (see, for example, U.S. Pat. No. 3,301,175). However, the former has disadvantages that uniform coating is difficult to effect, that the through-holes are likely to be clogged and that adhesion characteristics are deviated due to non-uniformity of the adhesive coating. In the latter, reliability of adhesion cannot be expected even though extremely complicated procedures are conducted with the greatest attention.

The present invention has been made with a view to overcoming the above-mentioned defects.

Accordingly, it is an object of the present invention to provide a completely insulated baseboard for a printed circuit board comprising a metal substrate having through-holes and a resin coat covering the overall surface of the metal substrate including the inner wall surfaces of the through-holes, thereby enabling a strong printed circuit board with a high density circuit to be provided.

It is another object of the present invention to provide a baseboard for a printed circuit board in which the through-holes are completely free of clogging thereof and have their circumferential angular edge portions coated with a sufficient thickness of a resin coat to withstand the electric voltage employed.

It is a further object of the present invention to provide a method of producing a baseboard of the character described above which is simply, effectively conducted at low cost.

Figure 2:
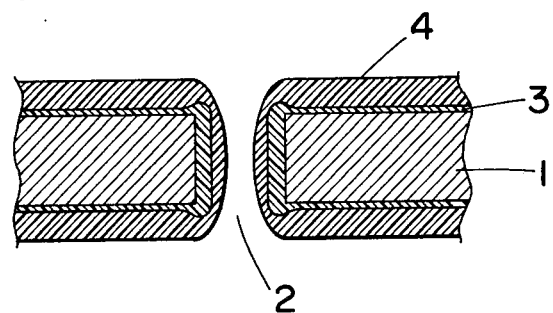
Figure 3:
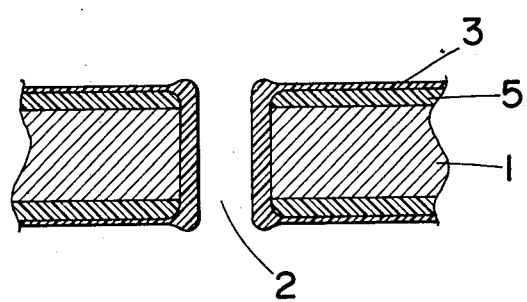

The foregoing and other objects, features and advantages of the present invention will be apparent to those skilled in the art from the following detailed description taken in connection with the accompanying drawing in which:

FIG. 1 is a partly cut-away cross sectional view of one form of a baseboard according to the present invention, illustrating an essential feature of the present invention;

FIG. 2 is a partly cut-away cross sectional view of another form of a baseboard according to the present invention, wherein an adhesive resin coat layer is formed on the insulating resin layer which is previously formed according to the essential method of the present invention; and FIG. 3 is a partly cut-away cross sectional view of a further form of a baseboard according to the present invention.

Essentially, in one aspect of the present invention, there is provided a baseboard for a printed circuit board which comprises a metal substrate having through-holes and a resin coat covering the overall surface of the metal substrate including the inner wall surfaces of the through-holes, characterized in that said resin coat comprises at least one coat layer formed on the overall surface of the metal substrate including the inner wall surfaces of the through-holes, and having, at the circumferential angular portions defined by the upper and the lower surface of said metal substrate and the inner wall surfaces of said through-holes, a thickness larger than that on said upper and said lower surface of the metal substrate.

As clear from the above, the baseboard for a printed circuit board having through-holes comprises a metal substrate and a resin coat covered thereon. The metal substrate is covered, at its overall surface including the inner walls of the through-holes, with at least one resin coat layer. Such resin coat layer has, at the circumferential angular edge portions (hereinafter often referred to as "circumferential angular portions") of the through-holes, a thickness larger than that on the upper and the lower surface of the metal substrate. The resin coat layer having a relatively large thickness at the circumferential angular portions of the through-holes imparts excellent insulation characteristics to the printed circuit board, enabling high density circuits to be provided.

The baseboard having such novel coat layer structure can also be produced by a method developed by the present inventors.

In another aspect of the present invention, there is provided a method of producing a baseboard for a printed circuit board comprisng applying onto the surface of a metal substrate having through-holes a resin coating, characterized in that the application of a resin coating is effected by dipping a metal substrate in a solution of a resin in a solvent which solution has a concentration of not more than 50% by weight and a viscosity of not more than 50 centipoises and taking the metal substrate out of said solution in a direction of at an angle of 90°±30° with respect to the axis of the through-holes of said metal substrate at a velocity of not more than 1,000 mm/min to form a resin coat layer covering the overall surface of the metal substrate including the inner wall surfaces of the through-holes and having, at the circumferential angular portions defined by the upper and the lower surface of said metal substrate and the inner wall surfaces of said through-holes, a thickness larger than that on said upper and said lower surface of the metal substrate. By dipping a metal substrate having through-holes in a solution of a resin in a suitable solvent (hereinafter often referred to as "resin solution") and taking out the metal substrate in such a specific manner as defined above, the through-holes are caused to fill with the resin solution due to capillarity. In the course of a subsequent drying and curing, the resin solution filled in the through-holes gradually decreases in volume due to the volatilization of the solvent. Such decrease starts at the both openings of the through-holes and progresses to form a resin membrane in the middle portion of the through-holes. At the extremity, the resin membrane comes to break to form a resin coat film not only on the inner wall of the through-hole but also on the circumferential angular portion of the through-holes. At the circumferential angular portion, there is formed a resin coat film in an increased thickness.

Referring now to FIG. 1, a resin coat layer 3 is formed on the overall surface of a metal substrate 1 including the inner wall surfaces of through-holes 2 and have, at the angular portions defined by the upper and lower surfaces of said metal substrate and inner wall surfaces of said through-holes, a thickness larger than the thickness on said upper and lower surfaces of the metal substrate, thereby to provide an increased insulating characteristics at said angular portions.

In practicing the method of the present invention, there is used a resin solution having a concentration of not more than 50% by weight. In the formation of the resin coat layer having a unique construction according to the present invention, breakage of the resin membrane is influenced by the concentration of the resin solution. In case the concentration of the solution is more than 50% by weight, the volatile content of the solution is insufficient so that desired breakage of the resin solution membrane formed in the through-holes is prevented. For causing breakage of the resin solution membrane, there is no critical lower limit in the concentration of the resin solution. But in view of a thickness of the resin coat layer necessary for a printed circuit board there is needed a concentration of 1% or more. The relation among a concentration (c) of the resin solution, a thickness (t) of the resulting coat layer on the inner wall of the through-hole and a radius (r) of the through-hole, is approximately expressed by the formula $$t(\mu) = 10 \times \frac{r(cm)}{2} \times c(wt\ \%)$$

For example, when the resin solution has a concentration of 1% and the diameter of the through-hole is 1 mm, there may be obtained, on the inner wall of the through-hole, a coat layer of about 2.5μ in thickness. The concentration of the resin solution may be varied depending on the purpose of the layer to be formed, but may preferably be in the range of 5 to 15% by weight. When the diameter of the through-hole is 1 mm and the solution having a concentration of 5 to 15% by weight is employed, there may be formed a coat layer of about 15 to 40μ in thickness.

The viscosity of the resin solution to be employed in the method of the present invention may be not more than 50 centipoises. By using the solution having a viscosity as mentioned above, the resin solution can be uniformly coated on the metal substrate having the through-holes and good appearance of the coated resin layer can be attained. For attaining such purposes, there is no lower limit in viscosity of the resin solution. However, there may preferably be employed a viscosity of 5 centipoises or more since if the viscosity is too low, the concentration of the resin solution naturally becomes low and a necessary thickness of the coat cannot be obtained. When the viscosity of the resin solution is 5 centipoises, there may be formed a coat layer having a thickness of several microns on the inner wall of the through-hole though the thickness may vary depending on a temperature or a kind of the resin employed.

Further, the viscosity may be determined in view of the breakage forming of the resin solution filled in the through-holes. When the resin solution having a high viscosity is employed, the concentration generally becomes high and the wet coating which is formed in the through-holes in the process of drying and curing cannot be broken. Accordingly, in the present invention the resin solution having a viscosity of not more than 50 centipoises, preferably 5 centipoises to 20 centipoises is employed.

The concentration and the viscosity of the resin solution are generally in proportion with each other but the relation therebetween varies depending on the kind and molecular weight of the resin employed and the kind of the solvent employed.

In this connection, it is to be noted that as mentioned hereinabove, the concentration is determined principally from the viewpoint of obtaining a desired breakage of the wet coating and the thickness of the layer to be coated on the inner walls of the through-holes, while the viscoisty is determined principally from the viewpoint of obtaining a uniform coating of the resin solution.

However, the concentration and the viscosity are, of course, determined so as to meet both of their respective requirements, without making a sacrifice of one of them.

Stated illustratively, when it is required to form a thick layer on the through-hole, the concentration of the resin in the solution should be high. For example, to form a resin layer of 100μ in thickness, the concentration should be as high as 45% by weight. However, this high concentration generally leads to high viscosity of the solution, which is not desirable to form a uniform coating. Accordingly, the viscosity of the solution is advantageously adjusted by heating.

As mentioned above, to obtain a baseboard of the present invention, the substrate is taken out of the solution at a low velocity of not more than 1000 mm/min. Such a low velocity is required to obtain a coating of uniformity and good appearance by sufficiently removing an excess solution when the board is being drawn out from the resin solution and to avoid bubbling. The taking out velocity is determined depending on the viscosity of the resin solution. In case the viscosity is high, the velocity should generally be low. If the viscosity is low, the board may be taken out at a high velocity. In order to achieve the desirable coating as mentioned above, the lower the velocity, the better the effect but in view of workability and productivity it is necessary to take out the substrate at a velocity of not less than 10 mm/min. In consideration of these requirements, it is preferable to take out the substrate at a velocity of not more than 300 mm/min and more preferably at a velocity of 50 to 200 mm/min. The taking out velocity is advantageously constant to form a uniform coat layer but of course it may be continuously or stepwise varied in the range of a relatively low velocity, namely, in the range not more than 1000 mm/min. In these cases, it is preferable that the velocity at the starting of the taking out operation is lower than that at the end of the operation.

To obtain a baseboard of the present invention, the substrate is taken out in a direction of at an angle of 90°±30° with respect to the axes of the through-holes. This is required for coating the upper and the lower surface of the substrate uniformly and for preventing irregular sags running off from the through-holes. Whatever direction the substrate is positioned in the taking out course, it is taken out in a direction of at an angle of 90°±30°, preferably in the perpendicular direction with respect to the axes of the through-holes. Most preferably, the substrate may be dipped into the resin solution in the vertical direction with respect to the level of the solution, that is, in such a direction that the axes of the through-holes may be horizontal with respect to the level of the solution, and taken out in the perpendicular direction with respect to the axes of the through-holes or vertical direction.

The position that the substrate assumes in the taking out course is not critical as mentioned above, but it is preferred to be in the direction at an angle of 90°±45° with respect to the level of the solution in view of workability or productivity. The substrate more preferably may assume a position in the vertical direction with respect to the level of the solution.

According to the method of the present invention as explained hereinbefore, there can be formed a resin layer having a thickness of 2 to 100μ on the inner walls of the through-holes including the circumferential angular portions defined by the upper and the lower surface of the metal substrate and the inner wall surfaces of said through-holes. A desirable thickness of the resin layer may be 10 to 40μ. In these cases, the thickness of the resin layer formed on the upper and lower surfaces of the substrate is 1/10 to 1/25 of the thickness of the layer on the inner walls of the through-holes.

As mentioned above, the essential method of the present invention comprising resin coating application by dipping provides a baseboard having through-holes for printed circuit board which baseboard is made from a metal as a substrate and is featured by its increased insulation characteristics especially at the circumferential angular portions of the through-holes. Such an essential method may be employed in combination with other methods of forming resin layers on metal substrates to obtain desired resin coated baseboards for printed circuit boards according to necessity. Specific examples of the various combinations of these methods are illustrated as follows:

In these combinations of the methods, the layer formation according to the essential method of the present invention is carried out substantially in the same manner as specified above, whether such layer formation is made directly on the substrate or on resin layer or layers previously formed on the substrate.

(1) After forming a resin layer by the dipping on the overall surface of the metal substrate including the inner walls of the through-holes according to the essential method of the present invention, an additional resin layer is formed mainly on the upper and the lower surface of said resin coated metal substrate, by conventional fluidization dip coating, electrostatic powder coating, spray coating, screen process, etc. The baseboard prepared by the dipping and the electrostatic powder coating is shown in FIG. 2, wherein the metal substrate 1 having the through-hole 2 is covered with the resin layer 3 according to the essential method of the present invention and the additional layer 4 according to the electrostatic powder coating.

Application of the additional resin coat layer onto the upper and the lower surface of the substrate with its overall surface covered with the resin coat layer may be effected by applying onto the substrate a resin solution while giving contraction stress to the applied coating. Stated illustratively, such an additional resin coat layer is applied using a curtain flow coater wherein the solution is dropped onto the surface of said substrate while moving the substrate in a horizontal direction at a velocity higher than that of the dropping of the solution. This method is suitable to form resin layers on the upper and the lower surface of the metal substrate having through-holes since the resin layers are formed without closing the through-holes. The solution to be employed has a viscosity of not less than 400 centipoises. A resin solution having a viscosity of 600 to 1000 centipoises may be preferably employed. The concentration of the resin solution is not critical but there is generally employed a resin solution having a concentration of 5 to 80% by weight and preferably employed a resin solution having a concentration of 10 to 30% by weight.

The moving velocity of the substrate is 20 to 40% higher than the dropping velocity of said solution. The moving velocity of the substrate is 30 to 200 m/min, preferably 80 to 130 m/min. Alternatively, the application of the resin coat layer may be effected without moving the substrate. In this case, the solution is dropped onto the substrate while moving a bath of the resin solution.

(2) After a resin layer is formed on the upper and the lower surface of a metal substrate having through-hole by the method as mentioned in (1) above, a resin layer is formed on the overall surface of the metal substrate including the inner walls of the through-holes according to the essential method of the present invention. In this case, the coating of the resin layer underlying the layer formed by the dipping may be carried out by electro-deposition. FIG. 3 shows the baseboard prepared by forming the resin layer directly on the upper and the lower surface of the substrate, giving contraction stress to the coating applied thereto and forming the resin layer by the dipping according to the essential method of the present invention. Numeral 1 designates the metal substrate, 2 the through-hole, 3 the resin layer formed by the dipping and 5 the resin layer formed on the upper and the lower surface of the substrate.

(3) After a resin layer is formed on the surfaces of a metal plate without through-holes according to a conventional method, such as film adhering, roll coating, spray coating, curtain flow coating, etc., and through-holes are perforated in a predetermined pattern, a resin layer on the overall surface of the metal plate including the inner walls of the through-holes is formed by the dipping according to the essential method of the present invention. A further resin layer may be formed at least on the upper and the lower surface of the metal plate covered with the resin layers, according to any one of the methods as mentioned in (1) above.

As can be understood from the above, in the essential method of the present invention for forming a resin layer on a metal substrate having through-holes, there is employed an insulating resin for insulating the metal substrate, an adhesive resin for enhancing adhesion ("adhesion" is used here to mean adhesion of circuits formed by electroless-plating to baseboard), or insulating, adhesive resin.

The essential method of the present invention as explained hereinbefore may be suitably used in various cases, for example, in case of forming an insulating resin layer for achieving insulation of a metal substrate; in case of forming, at least on inner walls of through-holes, an adhesive layer for enhancing adhesion between circuits formed by electroless copper plating and the surface of an insulating layer which is previously formed by the dipping according to the essential method of the present invention or formed by other conventional methods; or in case of forming, on the surfaces of a metal substrate having through-holes, a resin layer having not only insulation properties but also adhesion to circuits formed by electroless metal plating. The formation of these insulating and/or adhesive resin layers may be repeatedly effected according to necessity. In case coating of a solution of resin is repeatedly conducted to obtain a plurality of resin layers, coating of a further layer is carried out after a previously coated layer, namely underlying layer is cured by drying or heating according to necessity. Thus, the possible flowing out or deformation of the underlying resin layer in the process of the formation of said further layer is advantageously avoided.

Preferred modes of the present invention to produce a baseboard for a printed circuit board comprising a metal substrate are given hereinbelow.

(1) A baseboard for a printed circuit board comprising a metal substrate is produced by (a) forming an insulating, adhesive resin layer on the overall surface of the metal substrate including the walls of the through-holes in accordance with the essential method of the present invention as specified before.

(2) Another form of a baseboard for a printed circuit board comprising a metal substrate is produced by (a) firstly forming an insulating resin layer on the overall surfaces of the metal substrate including the walls of the through-holes in accordance with the essential method of the present invention and (b) further forming an insulating, adhesive resin layer on the overall surfaces of the resin coated substrate by conventional electrostatic powder coating.

(3) A still another form of a baseboard for a printed circuit board comprising a metal substrate is produced by (a) forming an insulating resin layer on the overall surface of the metal substrate including the walls of the through-holes in accordance with the essential method of the present invention, (b) forming an insulating resin layer on the overall surface of the resin coated substrate by electrostatic powder coating, (c) forming an adhesive resin layer on the overall surface of the resin coated substrate according to the same essential method of the present invention, and (d) forming on the upper and the lower surface of the resin coated substrate, an adhesive resin layer, using a resin solution having a viscosity of not less than 400 centipoises and giving a contraction stress to the applied coating.

(4) A still further form of a baseboard for a printed circuit board comprising a metal substrate is produced by (a) forming an insulating resin layer on the overall surface of the metal substrate including the inner walls of the through-holes by electrostatic powder coating, (b) forming an insulating resin layer on the overall surface of the resin coated substrate in accordance with the essential method of the present invention, (c) forming, on the upper and lower surfaces of the resin coated substrate, an adhesive resin layer, using a solution having a viscosity of not less than 400 centipoises and giving a contraction stress to the applied coating, and (d) forming an adhesive resin layer on the overall surface of the resin coated substrate by electrostatic powder coating, in accordance with the essential method of the present invention.

(5) A still another form of a baseboard for a printed circuit board comprising a metal substrate is produced by (a) forming an insulating resin layer on the surfaces of a non-perforated metal plate by roll coating, (b) perforating the metal plate to have through-holes in predetermined pattern, (c) forming an insulating resin layer on the overall surface of the resin coated substrate including the walls of the through-holes in accordance with the essential method of the present invention, and (d) forming, on the upper and the lower surface of the resin coated substrate, an adhesive resin layer employing an adhesive resin solution having a viscosity of not less than 400 centipoises and giving contraction stress to the applied coating.

As known from the above, at least one resin layer in the resin coat covering the metal substrate is formed by the dipping according to the essential method of the present invention and formation of further resin layer or layers may be suitably made before and/or after said resin layer formation of the essential method. However, it is to be noted that at least one layer covering the overall surface of the substrate is made from an insulating or an insulating, adhesive resin and at least the outermost layer is made from an adhesive or an insulating, adhesive resin.

As a metal substrate employable in the present invention, there may be mentioned a substrate made of iron, aluminum or alloys thereof. The substrate may be 0.5 to 5 mm in thickness. The through-holes have a diameter of 0.8 to 5 mm.

For forming an insulating layer, there may be employed commercially available resins which are commonly used for insulating a metal substrate by coating. For example, there can be mentioned an epoxy resin, phenol resin, polyester resin, polyamide resin, polyamideimide resin, polyimide resin, urea resin, melamine resin, polyvinyl acetal resin, vinyl chloride, fluorine resin, polyacrylic acid ester resin, polymethacrylic acid ester resin, and the like. They may be used alone or in mixture.

For forming an adhesive layer, there may be employed commercially available resins which are usually used in the field of printed circuit board. For example, there can be mentioned an NBR, SBR, synthetic rubber such as chloroprene rubber, chlorosulfonated polyethylene rubber or the like, natural rubber, rubber/phenol resin, rubber/epoxy resin, polyacetal/phenol resin, epoxy resin or the like. They may be used also alone or in mixture. Catalysts generally used in electroless metal plating may be incorporated into these adhesive resins. As specific examples of such catalysts, there can be mentioned palladium, gold, platinum, copper, tin, etc.

Specific examples of the insulating, adhesive resins include an epoxy resin, rubber/phenol resin and epoxy resin/rubber. These resins may be used alone or in mixture. Further, fillers such as calcium carbonate, silica, zinc oxide, titanium oxide, zirconium silicate, talc and the like may be incorporated in the insulating, adhesive resins as an extender or for the purpose of imparting fire retardancy or coloring.

Specific examples of the solvents to be employed in the present invention include methyl ethyl ketone, acetone, methyl yl-butyl ketone, toluene, xylene, methanol, ethanol, isopropanol, methyl cellosolve, ethyl cellosolve, cellosolve acetate, ethyl acetate, dimethylformamide, ethylene glycol monomethyl ether and the like. They can be used alone or in mixture.

The present invention will now be described in detail by reference to the following Examples that by no means limit the scope of the present invention.

Unless otherwise specified, the percentage appearing in the Examples are given by weight.

The properties shown in Examples were measured in the following method.

1. Dielectric breakdown voltage: A sample of an insulating resin coated baseboard of 110×110 mm in size was prepared. The insulating resin layer coated on the baseboard was cut away in size of 10×10 mm at a corner portion of the sample to disclose the metal substrate of the baseboard. The disclosed metal substrate was used as one electrode. The sample was immersed in a glass vessel containing mercury therein, keeping the metal disclosed portion spaced from the mercury by 10 mm. The mercury was used as another electrode. To these electrodes were connected a power source and instruments as defined by JIS K-6911-1970, item 5.8.2. A voltage applied across the electrodes at 20° C. was raised from 0 V by 20 V/sec until the insulation was broken down. The voltage at break down was defined as a dielectric breakdown voltage.

2. Peel strength test was conducted in accordance with JIS C6481, item 5.7.

3. Drawing strength: Conductors of printed circuits located on upper and lower peripheral edge portions of a through-hole were ground to be removed, leaving conductors of the circuits only on the inner wall of the through-hole. A wire of soft iron having a diameter of 0.8 mm was inserted in the through-hole and fixed thereto by soldering. The soft iron wire was pulled at a velocity of 200 mm/min. using a tensile machine. The load at a break of the through-hole was measured.

EXAMPLE 1

To 540 parts by weight of methyl ethyl ketone and 20 parts by weight of ethylene glycol monomethyl ether were dissolved 50 parts by weight of EPIKOTE 1001 (trade name of an epoxy resin manufactured and sold by Shell Chemical Corp.), 20 parts by weight of NIPOL 1032 (trade name of acrylonitrile butadien rubber manufactured and sold by NIPPON ZEON CO. LTD., Japan), 30 parts by weight of HITANOL 2400 (trade name of alkylphenol resin manufactured and sold by HITACHI CHEMICAL CO. LTD., Japan), 2 parts by weight of dicyandiamide and 13 parts by weight of calcium carbonate to prepare a solution of three kinds of resins (hereinafter referred to as "resin solution") which has insulation properties and adhesive properties and has a concentration of 17% and a viscosity of 23 centipoises at 23° C.

Into the prepared resin solution was vertically dipped an iron plate of 1.2 mm in thickness having through-holes of 1.0 mm, 1.3 mm, 1.5 mm and 2.0 mm in diameter. Thereafter, the iron plate was taken out of the resin solution in the perpendicular direction with respect to the axial direction of the through-holes at a constant velocity of 150 mm/min, air-dried at a room temperature for 2 minutes and then dry-cured at 160° C. for 10 minutes to form a film on the overall surfaces of the iron plate including the inner walls of the through-holes.

Same procedures as mentioned above were repeated three times in total. Final dry-curing was conducted at 160° C. for 60 minutes. The thickness of the film formed on the walls of the respective through-holes and the circumferential angular portions defined by the walls of the through-holes and the surfaces of the iron plate were 150μ. The thickness of the film formed on the upper and lower surfaces of the plate was 40μ.

The resin coat comprising these layers had a dielectric breakdown voltage of more than 2.0 KV.

Printed circuits were formed on this baseboard according to the following steps and procedures:

1. Chemical roughening: The baseboard was immersed in a solution formed of 15 g of $K_2Cr_2O$, 100 ml of concentrated $H_2SO_4$ and 50 ml of water, at 40° C. for 15 minutes.

2. Sensitizing: The baseboard was further immersed in 1000 ml of a solution formed of 10 g of $SnCl_2$, 40 ml of HCl and a balance of water, at 60° C. for 5 minutes.

3. Activating: The baseboard was further immersed in 1000 ml of a solution formed of 2 g of $PdCl_2$, 20 ml of HCl and a balance of water, at 20° C. for 5 minutes.

4. Chemical plating: The baseboard was immersed in 1000 ml of a solution formed of 29 g of copper sulfate, 140 g of sodium potassium tartarate, 40 g of sodium hydroxide, 166 ml of a 37% formalin and a balance of water, at 30° C. for 1 hour.

5. The baseboard was then subjected to electro-plating to increase the thickness of the conductors up to 35μ.

Peel strength of the thus formed circuit board was more than 1.8 kg/cm. Any change was not observed on the circuits even after the printed circuit board was allowed to stand in a bath of solder at 260° C. for more than 30 seconds.

EXAMPLE 2

60 Parts by weight of EPIKOTE 1001, 50 parts by weight of VP-13N (trade name of resol type phenoric resin manufactured and sold by Hitachi Chemical Co. Ltd., Japan) and 15 parts by weight of SLEC BM-2 (trade name of polyvinyl butyral manufactured and sold by Sekisui Chem. Co., Japan) were dissolved in 640 parts by weight of methyl ethyl ketone to prepare an insulating resin solution having a concentration of 13% and a viscosity of 6 centipoises (23° C.).

An iron substrate identical with that of Example 1 was dipped vertically in the solution and taken out of the solution in the perpendicular direction with respect to the axes of the through-holes at a velocity of 100 mm/min. The resin solution applied to the substrate was then air-dried at a room temperature for 2 minutes and further dried at 160° C. for 30 minutes to be cured.

The thickness of the coated resin layer in section was measured using a microscope. The layer has a thickness of 30μ on the inner wall of the through-hole and a thickness of 2μ on the upper and lower surfaces of the iron substrate.

The iron substrate on which the insulating resin layer had been formed was then subjected to the following electrostatic powder coating to form an adhesive layer thereon.

100 Parts by weight of EPIKOTE 1004 (trade name of an epoxy resin manufactured and sold by Shell Chemical Corp.) and 10 parts by weight of NIPOL 1032 (trade name of acrylonitrile-butadiene rubber manufactured and sold by NIPPON ZEON Co. Ltd., Japan) were kneaded using an 8-inch mixing roll. The materials were cooled to be cured and then crushed. To the thus crushed material were added with successive 4 parts by weight of dicyandiamide, 15 parts by weight of calcium carbonate, 2 parts by weight of finely divided silica and 1 part by weight of MODAFLOW (trade name of a flow modifier manufactured and sold by Monsant Co., U.S.A.). These materials were subsequently subjected to dry mixing using SUPER MIXER SMV20 (trade name of a mixer manufactured and sold by Kawada Seisakusho, Japan) and then subjected to melt mixing using COKNEADER (trade name of a kneader manufactured and sold by Buss Co., U.S.A.). Thereafter, the materials were cooled to be cured and pulverized and then sifted with a 60 mesh sieve to prepare powder of the materials.

Electrostatic powder coating was carried out using the prepared powder, at −60KV for 10 seconds, and curing was effected at 180° C. for 60 minutes. The thickness of the layer formed by the electrostatic powder coating was 150μ at the upper and lower surfaces of the substrate, 50μ at the circumferential angular portion of the through-hole and 100μ at the central portion of the through-hole wall.

The dielectric breakdown voltage of the thus prepared baseboard was more than 2.0 KV. Printed circuits were formed on the baseboard in the same manner as of Example 1. The peel strength was more than 1.8 kg/cm at any portion of the circuits and no change was observed after the printed circuit board had been allowed to stand in a bath of solder at 260° C. for more than 30 seconds.

EXAMPLE 3

A 60% methyl ethyl ketone solution of 100 parts by weight of EPIKOTE 1001 and 4 parts by weight of a curing agent, dicyandiamide, was mixed with the same amount of a 10% methyl ethyl ketone solution of SLEC BH-4 (trade name of polyvinyl acetal resin manufactured and sold by Sekisui Chem. Co., Japan). The formed solution was diluted with methyl ethyl ketone until the concentration of the total resins in the solution became about 9% to form an insulating resin solution having a viscosity of 10 centripoises (23° C.). An iron substrate identical with that of Example 1 was vertically dipped in the solution and taken out of the solution in the perpendicular direction with respect to the axial direction of the through-hole at a velocity of 100 mm/min, and then air-dried at room temperature for 2 minutes. The equilibrium condition of the solution contained in the through-hole was broken and the film of the solution was formed on the inner wall and circumferential angular portion of the through-hole. After dried and cured at 160° C. for 30 minutes, the thickness of the film formed at the through-hole portion was measured using a microscope. The film formed at the through-hole portion measured 30 to 35μ in thickness. The film formed on the upper and lower surfaces of the substrate measured 1 to 3μ in thickness.

Subsequently, the resin solution formed of the above-mentioned 60% epoxy resin solution and the same amount of 10% polyvinyl acetal resin solution was diluted with cellosolve acetate to form a solution having a 25% concentration of the total resins and a viscosity of 700 centipoises (23° C.). The thus formed solution was let to fall through a slit of 0.9 mm wide of LZE type curtain flow coater manufactured and sold by Robert Burkle & Co.) at a velocity of 100 m/min and the substrate on which the resin layer had been formed as mentioned above was let to pass through the flow of the resin solution at a velocity of 125 m/min to form a resin layer on the upper and lower surfaces of the substrate. Any of the through-holes was not closed by entering of the solution into the through-holes. After dried and cured at 160° C. for 30 minutes, the resin layer on the upper and lower surfaces measured about 35μ in thickness. These insulating layers had a dielectric breakdown voltage more than 2 KV.

Further, 60 parts by weight of NIPOL 1032, 30 parts by weight of HITANOL 2400 and 10 parts by weight of EPIKOTE 1001 were dissolved in methyl ethyl ketone to prepare two kinds of solution, namely, an adhesive solution having a concentration of 8% and a viscosity of 8 centipoises (23° C.) and an adhesive solution having a concentration of 25% and a viscosity of 800 centipoises (23° C.). These solutions were further applied, according to the method as mentioned above in the present Example, to form adhesive layers all over the baseboard and only on the upper and lower surfaces, respectively. The adhesive layers on the inner wall of the through-hole measured about 25μ in thickness and the adhesive layers on the upper and lower surfaces of the baseboard measured 50μ after 2 times curtain flow coatings.

Printed circuits are formed on the thus prepared baseboard according to electroless copper plating as conducted in Example 1. The adhesion of the printed circuits was more than 1.8 kg/cm in terms of peel strength at any portion of the circuits. The drawing strength of the through-hole was more than 5 kg and no change was observed after the printed circuit board had been allowed to stand in a bath of solder at 260° C. for more than 30 seconds.

EXAMPLE 4

An epoxy resin cast layer was formed on a substrate identical with the substrate as used in Example 1 by electrophoretic deposition, and dried to be cured at 80° C. for 10 minutes, at 120° C. for 20 minutes and at 160° C. for 60 minutes. The thus formed insulating layer had a thickness of 40μ at a circumferential angular portion of the through-hole, 180μ at a central portion of the through-hole wall and 150μ at the upper and lower surfaces of the board.

Thereafter, adhesive layers were formed at the through-hole portions and on the upper and lower surfaces of the board in the same manner as of Example 3.

The dielectric breakdown voltage of the obtained baseboard was about 1 KV and the adhesion of the printed circuits formed thereon according to the same electroless copper plating method as of Example 1 was excellent. Stated illustratively, the circuits had a peel strength of about 1.8 kg/cm and no change was observed after the printed circuit board had been allowed to stand in a bath of solder at 260° C. for more than 30 seconds.

COMPARATIVE EXAMPLE 1

Substantially same procedures as of Example 1 were repeated except that a solution having a concentration of 60% and a viscosity of 300 centipoises (23° C.) was employed. Closure of through-holes was observed and desired resin layer was not formed on the inner walls of the through-holes.

COMPARATIVE EXAMPLE 2

Substantially same procedures as of Example 2 were repeated except that an insulating resin solution having a concentration of 30% and a viscosity of 70 centipoises (23° C.) was employed. The layer formation was insufficient at circumferential angular portions of the through-holes and the appearance of the formed layer was not good.

COMPARATIVE EXAMPLE 3

Substantially same procedures as of Example 2 were repeated except that the substrate dipped in the insulating resin solution was taken out thereof at a velocity of 1,200 mm/min. The resin layers thus formed on the upper and lower surfaces of the substrate were not uniform in thickness and had a thickness of 15μ at its portions which had been at an upper position in the course of taking out of the substrate from the solution and a thickness of 23μ at its portions which had been at a lower position in the course of taking out of the substrate from the solution. Furthermore, flow lines were formed on the surfaces of the layers and the appearance of the baseboard was not good.

COMPARATIVE EXAMPLE 4

Substantially same procedures as of Example 2 were repeated except that the substrate was taken out of the insulating resin solution in the direction of 50° with respect to the axes of the through-holes. Flowing of the solution from the through-hole to the side opposite to the taking out direction of the substrate was observed and it was difficult to obtain uniform layer formation on the both surfaces of the substrate.

What is claimed is:

1. A method of producing a baseboard for a printed circuit board comprising applying onto the surface of a metal substrate a resin coating, characterized in that the application of a resin coating is effected by dipping a metal substrate having through-holes in a solution of a resin in a solvent which solution has a resin concentration of not more than 50% by weight and a viscosity of not more than 50 centipoises and taking the metal substrate out of said solution in a direction of at an angle of 90°±30° with respect to the axis of the through-holes of said metal substrate at a velocity of not more than 1,000 mm/min to form a resin coat layer covering the overall surface of the metal substrate and filling the through-holes which, upon drying, forms a membrane over said holes which breaks and results in the formation of a coating on the inner wall surfaces of the through-holes and in the formation, at the circumferential edges formed by the intersection of the upper and lower surfaces of said metal substrate with the inner walls of said through-holes, of a coating having a thickness larger than the thickness of said coating on said upper and said lower surface of the metal substrate.

2. A method according to claim 1, characterized in that said resin is an insulating resin.

3. A method according to claim 1, characterized in that said resin is an adhesive resin.

4. A method according to claim 1, characterized in that said resin is an insulating, adhesive resin.

5. A method according to claim 1, characterized in that after said application of the resin coating by the dipping is effected, the metal substrate with its overall surface covered with said resin coat layer is further covered, at least one the upper and the lower surface thereof, with other resin coating.

6. A method according to claim 5, characterized in that said other resin coating is applied by an electrostatic powder coating method.

7. A method according to claim 5, characterized in that the resin of said resin coating is an insulating resin and the resin of said other resin coating is an adhesive resin.

8. A method according to claim 5, characterized in that the resin of said resin coating is an insulating resin and the resin of said other resin coating is an insulating adhesive resin.

9. A method according to claim 5, characterized in that said application of the resin coating by the dipping is effected two or more times.

10. A method according to claim 5, characterized in that the application of said other resin coating is effected by the method as claimed in claim 1.

11. A method according to claim 5, characterized in that said other resin coating is applied by dropping a solution of a resin in a solvent which solution has a viscosity of not less than 400 centipoises onto the surface of said metal substrate while moving said metal substrate in a horizontal direction at a velocity higher than that of the dropping of said solution.

12. A method according to claim 11, characterized in that the moving velocity of said metal substrate is 20 to 40% higher than the dropping velocity of said solution.

13. A method according to claim 11, characterized in that said other resin coating is applied by a curtain flow coating method.

14. A method according to claim 1, characterized in that before said application of the resin coating by the dipping is effected, the metal substrate having through-holes is covered, at least on the upper and the lower surface thereof, with other resin coating.

15. A method according to claim 14, characterized in that said other resin coating is applied by an electrostatic powder coating method.

16. A method according to claim 14, characterized in that said application of the resin coating by the dipping is effected two or more times.

17. A method according to claim 14, characterized in that said other resin coating is applied by dropping a solution of a resin in a solvent which solution has a viscosity of not less than 400 centipoises onto the surface of said metal substrate while moving said metal substrate in a horizontal direction at a velocity higher than that of the dropping of said solution.

18. A method according to claim 17, characterized in that the moving velocity of said metal substrate is 20 to 40% higher than the dropping velocity of said solution.

19. A method according to claim 17, characterized in that said other resin coating is applied by a curtain flow coating method.

20. A method according to claim 1, characterized in that before said application of the resin coating by the dipping is effected, the metal substrate without through-holes is covered, on the upper and the lower surface thereof, with other resin coating and subsequently perforated to have through-holes in a predetermined pattern therein.

21. A method according to claim 20, characterized in that said application of the resin coating by the dipping is effected two or more times.

22. A method according to claim 20, characterized in that after said application of the resin coating by the dipping is effected, the metal substrate with its overall surface covered with said resin coat layer is further covered, at least on the upper and the lower surface thereof, with other 23. A method according to claim 22, characterized in that said application of the resin coating by the dipping is effected two or more times.

24. A method according to claim 22, characterized in that the application of said other resin coating is effected by the method as claimed in claim 1.

25. A method according to claim 1, characterized in that said other resin coating is applied by a roll coating method.

26. A method according to claim 1, characterized in that said application of the resin coating by the dipping is effected two or more times.

27. A method according to claim 1, characterized in that said other resin coating is applied by an electrostatic coating method.

* * * * *